United States Patent
Attner et al.

(10) Patent No.: US 10,259,252 B2
(45) Date of Patent: Apr. 16, 2019

(54) SECURITY ELEMENT FOR A SECURITY DOCUMENT AND PROCESS FOR THE PRODUCTION THEREOF

(71) Applicant: LEONHARD KURZ Stiftung & Co. KG, Furth (DE)

(72) Inventors: Juri Attner, Burgthann (DE); Rene Staub, Hagendorn (CH); Klaus Weber, Zirndorf (DE)

(73) Assignee: LEONHARD KURZ STIFTUNG & CO. KG, Furth (DE)

( * ) Notice: Subject to any disclaimer, the term of this patent is extended or adjusted under 35 U.S.C. 154(b) by 205 days.

(21) Appl. No.: 15/158,037

(22) Filed: May 18, 2016

(65) Prior Publication Data

US 2016/0257159 A1 Sep. 8, 2016

Related U.S. Application Data

(62) Division of application No. 12/449,366, filed as application No. PCT/EP2008/000926 on Feb. 7, 2008.

(30) Foreign Application Priority Data

Feb. 7, 2007 (DE) .......................... 10 2007 005 884
Aug. 23, 2007 (DE) .......................... 10 2007 039 996

(51) Int. Cl.
*B42D 25/29* (2014.01)
*B42D 25/21* (2014.01)
(Continued)

(52) U.S. Cl.
CPC .............. *B42D 25/29* (2014.10); *B32B 29/06* (2013.01); *B42D 25/21* (2014.10); *B42D 25/324* (2014.10);
(Continued)

(58) Field of Classification Search
CPC ...... B42D 25/29; B42D 25/21; B42D 25/373; B42D 25/355; B42D 25/387;
(Continued)

(56) References Cited

U.S. PATENT DOCUMENTS 6,491,324 B1  12/2002  Schnmitz et al.
7,823,928 B2  11/2010  Reinhart et al.
(Continued)

FOREIGN PATENT DOCUMENTS

CN  1589205    3/2005
DE  10226114   7/2003
(Continued)

*Primary Examiner* — Justin V Lewis
(74) *Attorney, Agent, or Firm* — Hoffmann & Baron, LLP

(57) ABSTRACT

The invention concerns a security element for a security document comprising a structure layer and diffractive first and second relief structures, wherein the relief structures viewed parallel to the plane of the structure layer are arranged in different planes of the security element, wherein the first relief structure adjoins a partial first reflection layer and the second relief structure adjoins a partial second reflection layer, and wherein—if the first reflection layer is towards a viewer—a second item of information generated by the second relief structure is at least partially concealed and—if the second reflection layer is towards the viewer—a first item of information generated by the first relief structure is at least partially concealed, and processes for the production of such security elements and security documents formed therewith.

12 Claims, 12 Drawing Sheets

(51) Int. Cl.
*G03F 7/00* (2006.01)
*B42D 25/373* (2014.01)
*B32B 29/06* (2006.01)
*D21H 21/40* (2006.01)
*B42D 25/328* (2014.01)
*B42D 25/36* (2014.01)
*B42D 25/324* (2014.01)
*B42D 25/351* (2014.01)
*B42D 25/364* (2014.01)
*B42D 25/382* (2014.01)
*B42D 25/387* (2014.01)
*B42D 25/355* (2014.01)
*B42D 25/333* (2014.01)

(52) U.S. Cl.
CPC ......... *B42D 25/328* (2014.10); *B42D 25/351* (2014.10); *B42D 25/355* (2014.10); *B42D 25/36* (2014.10); *B42D 25/364* (2014.10); *B42D 25/373* (2014.10); *B42D 25/382* (2014.10); *B42D 25/387* (2014.10); *D21H 21/40* (2013.01); *G03F 7/0035* (2013.01); *B42D 25/333* (2014.10); *B42D 2035/36* (2013.01)

(58) Field of Classification Search
CPC .. B42D 25/382; B42D 25/364; B42D 25/351; B42D 25/36; B42D 25/324; B42D 25/328; B42D 25/333; B42D 2035/36; G03F 7/0035; D21H 21/40; B32B 29/06
USPC .................. 283/67, 70, 72, 94, 98, 901
See application file for complete search history.

(56) References Cited

U.S. PATENT DOCUMENTS

| | | | |
|---|---|---|---|
| 2002/0030360 | A1 | 3/2002 | Herrmann et al. |
| 2005/0104364 | A1* | 5/2005 | Keller .................. B42D 25/29 283/72 |
| 2005/0151368 | A1 | 7/2005 | Heim |
| 2007/0114787 | A1 | 5/2007 | Heim |
| 2008/0094713 | A1 | 4/2008 | Tompkin et al. |
| 2008/0310025 | A1 | 12/2008 | Staub et al. |
| 2009/0061159 | A1 | 3/2009 | Staub et al. |

FOREIGN PATENT DOCUMENTS

| | | |
|---|---|---|
| DE | 102004042136 | 3/2006 |
| DE | 102005017169 | 10/2006 |
| JP | 2004117682 | 4/2004 |
| JP | 2006251784 | 9/2006 |
| JP | 2006306085 | 11/2006 |
| RU | 2193975 | 7/1998 |
| RU | 2170788 | 4/2000 |
| RU | 2286887 | 11/2006 |
| WO | WO9510420 | 4/1995 |
| WO | WO9719820 | 6/1997 |
| WO | WO0200445 | 1/2002 |
| WO | WO03070482 | 8/2003 |
| WO | WO2004097112 | 11/2004 |
| WO | WO2006029609 | 3/2006 |
| WO | WO2006061586 | 6/2006 |
| WO | WO2006066803 | 6/2006 |
| WO | WO2006084685 | 8/2006 |

* cited by examiner

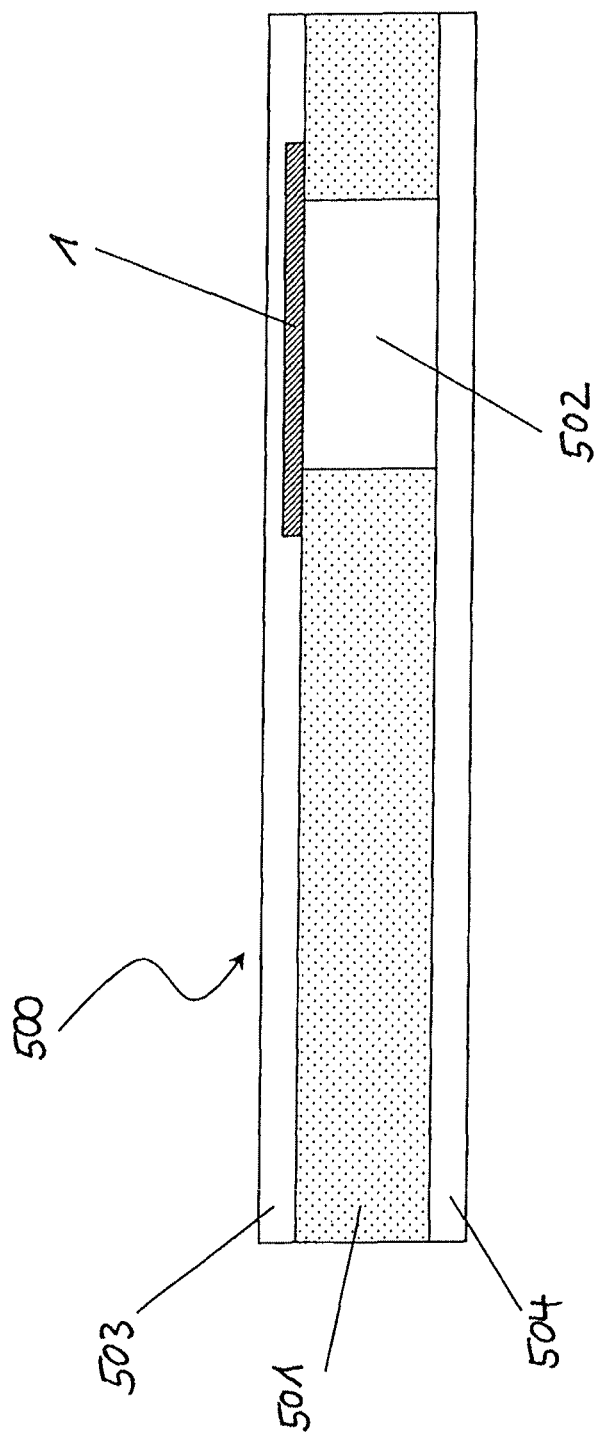

SECURITY ELEMENT FOR A SECURITY DOCUMENT AND PROCESS FOR THE PRODUCTION THEREOF

This application is a divisional application of U.S. application Ser. No. 12/449,366, filed on Oct. 28, 2009, which claims priority based on an International Application filed under the Patent Cooperation Treaty, PCT/EP2008/000926, filed on Feb. 7, 2008 and German Application No. DE 102007005884.7, filed on Feb. 7, 2007 and German Application No. DE 102007039996.2, filed on Aug. 23, 2007.

BACKGROUND OF THE INVENTION

The invention concerns a security element having at least one structure layer which is at least region-wise transparent, a diffractive first relief structure which is arranged at least region-wise, and a diffractive second relief structure which is arranged at least region-wise, wherein the first and second relief structures differ at least region-wise and are arranged in different planes of the security element as viewed parallel to the plane of the structure layer, wherein the first relief structure adjoins a first reflection layer with a first contour and the second relief structure adjoins a second reflection layer with a second contour. The invention further concerns various processes for the production of such a security element and a security document having a security element of that kind.

Security elements involving a structure of that kind are known from DE 10 2005 017 169 A1. They are applied here to a security document by means of a transfer film. That arrangement has a thin structure layer which is not self-supporting and which involves a layer thickness <10 µm. After the application of the security element to a security document the first relief structure is arranged at the surface of the security document and can have an optical and/or technical function or can also be detected by tactile means. The security element on the security document can be viewed from only one side or alternatively from both sides.

WO 97/19820 A1 describes a security element in the form of an information carrier with a self-supporting structure layer of a layer thickness of >20 µm, which is applied to a security document, for example a cheque. Viewing of the security element is provided only on its side that is remote from the security document.

In the case of the known security elements, as viewed at least from one side of the security element, the first reflection layer and at the same time at least regions of the second reflection layer are visible, in which respect optical effects of the first relief structure and the second relief structure are visible in combination.

SUMMARY OF THE INVENTION

Now the object of the invention is further to increase the safeguard against forgery of a security element and of a security document provided therewith, and to provide a process for the formation of such a security element.

For a security element having at least one structure layer which is at least region-wise transparent, a diffractive first relief structure which is arranged at least region-wise, and a diffractive second relief structure which is arranged at least region-wise, wherein the first and second relief structures differ at least region-wise and are arranged in different planes of the security element as viewed parallel to the plane of the structure layer, wherein the first relief structure adjoins a first reflection layer with a first contour and the second relief structure adjoins a second reflection layer with a second contour, that object is attained in that the first reflection layer and the second reflection layer are arranged region-wise as viewed perpendicularly to the plane of the structure layer and at least region-wise overlap, wherein at least sub-regions of the first and second contour extend in congruent relationship with each other as viewed perpendicularly to the plane of the structure layer and in adjoining relationship with at least one transparent region of the structure layer and—if the first reflection layer is towards a viewer—a second item of information generated by the second relief structure in the region of the overlap is at least partially concealed and—if the second reflection layer is towards the viewer—a first item of information generated by the first relief structure in the region of the overlap is at least partially concealed.

The security element formed is difficult to imitate and at the same time is optically particularly attractive and easily remembered so that it is extremely tamper-proof. The security element is of a region-wise transparent nature. In particular, it appears predominantly transparent to a person viewing it, wherein the transparent regions preferably make up more than 50% of the area of the security element. It is therefore particularly suitable as a window element or also as a security thread for security documents.

It has proven desirable if the first and second information at least region-wise differ from each other. A 3D effect can be achieved on the security element in that way.

A mean spacing between the first and second reflection layers is preferably less than 15 µm.

Preferably the first reflection layer is opaque and when facing towards the viewer at least region-wise conceals the second information and optionally further items of information generated by the second relief structure. Alternatively the first reflection layer is transparent and at least one first opaque auxiliary layer at least region-wise conceals the second information and optionally also further items of information generated by the second relief structure.

Preferably the second reflection layer is also opaque and when facing towards the viewer at least region-wise conceals the first information and optionally further items of information generated by the first relief structure. Alternatively the second reflection layer is transparent and at least one second opaque auxiliary layer at least region-wise conceals the first information and optionally also further items of information generated by the first relief structure.

In that respect the first and second auxiliary layers can also be formed by a single layer which can be associated with both reflection layers. By way of example an opaque region of the structure layer can form a single auxiliary layer which is superposed both on the first reflection layer which is of a region-wise nature and also the second reflection layer which is of a region-wise nature.

In that respect an opaque reflection layer is opaque in nature preferably when viewed in incident light and in a transillumination situation. It is however equally possible that reflection layers appear opaque to a human eye only when viewed in incident light or reflection. When viewed in a transillumination situation, such a reflection layer can have locally visibly differing transmission so that therefore, when using transillumination, noticeably more visible light passes through regions of the reflection layer than through other regions of that reflection layer. That is preferably achieved by means of different layer thickness ranges or by means of very small openings in the reflection layer or layers.

In that respect, a human viewer perceives a region of a reflection layer as being opaque when viewed in a transillumination situation, if the transmission for visible light is less than 5%, in particular less than 1%. When transillumination is involved, a viewer perceives as translucent, regions with a transmission for visible light of greater than 10%, in particular greater than 20%. In that respect, when incident light is involved, a viewer can have the impression of an opaque layer region, in the regions which are perceived as being translucent in transillumination. If for example a metallic reflection layer is used, the regions which are perceived as opaque and translucent when transillumination is involved reflect differently at a maximum by a factor of 0.2, when viewed in incident light. Transmission which differs by the factor of 2 can be clearly perceived by the human eye while a difference in reflection of up to about 20% can scarcely be perceived.

The items of information generated by the diffractive relief structures exhibit in particular optically variable effects such as viewing angle-dependent colour changes, kinematic effects, holograms, shine and scatter effects and the like.

Preferably symmetrical or asymmetrical relief structures are used for forming the diffractive first and/or second relief structures or parts thereof. In that respect the relief structures may be periodic or non-periodic.

The term symmetry is not used here in the strictly mathematical sense but is used to distinguish from the asymmetrical relief structures described hereinafter. Relief structures are also referred to as symmetrical which, upon folding at a line of symmetry, cannot be brought completely into coincident relationship, but the flanks thereof differ so little from each other in the magnitude of their slope that an optical effect which is dependent on viewing does not occur.

The term asymmetrical relief structure is used to denote for example a sawtooth structure. In that case the slope of the sawtooth flanks differs preferably significantly. In particular a flank has a finite slope while the other flank has an infinite slope. If an asymmetrical relief structure with a non-constant period length/spatial frequency is used, it can be provided that the diffractive first and/or second relief structure is a relief structure which is formed, starting from a reference point, in at least two directions, with changing spatial frequency or depth. With a changing spatial frequency the flank slope of the asymmetrical relief structure also changes, that is to say a flank angle formed between the flank and a main plane which is parallel to the surface of the relief structure increases with increasing flank slope or flank gradient. It can be provided that the spatial frequency increases starting from the reference point, preferably continuously increases. The flank steepness thus increases towards the edge of the relief structure. In that case the inclined flanks can also be portions of steady curves. This therefore involves a structure having an optical-diffraction effect, with a relief structure which preferably continuously changes in respect of the spatial frequency and optionally further grating constants over the surface region and which is of such a configuration that the respective one flanks of the grating grooves extend parallel to each other and approximately parallel to a perpendicular to the main plane of the relief structure while the angle of the respective other flanks of the grating surfaces with respect to the main plane changes substantially continuously over the surface region, with the grating depth being at most 10 µm.

A relief structure can further be formed by a blaze grating. The blaze grating is a diffraction grating. The following relationship applies between the entry angle $\Theta_{in}$ and the exit angle $\Theta_{out}$ at a blaze grating in dependence on the grating constant d, the wavelength λ and the diffraction order n:

$$\sin \Theta_{out} = \sin \Theta_{in} + n * \lambda/d$$

That is to say, polychromatic light such as for example daylight is broken down into its basic colours by diffraction at the blaze grating. By virtue of the choice of the grating constants d however the blaze grating can be in the form of an achromatic blaze grating in which the coloured rays at least of the first diffraction order, in a viewing angle range, are brought together again and thus once again polychromatic light issues from the blaze grating. In that way about 90% of the incident light can be diffracted as a focused beam whereby the image effect has a particularly high level of contrast. It is from that property that the name of the grating is derived.

It can advantageously be provided that the blaze grating is an achromatic blaze grating with a grating constant of 20 µm to 3 µm, preferably 10 µm, and with a profile depth of 0.3 µm to 5 µm, preferably 1.5 µm. In dependence on the profile depth, higher diffraction orders can provide a higher level of intensity than the first diffraction order.

It can further be provided that the blaze grating is a chromatic blaze grating with a grating constant of less than 2 µm, preferably 1 µm. In that case the blaze grating lights up in the colours of the rainbow upon being tilted under daylight illumination.

It can further be provided that a relief structure is in the form of a matt structure. The matt structure is a relief structure which diffusely scatters light and which therefore appears matt. Such a relief structure can typically involve a structure depth of ≤10 µm. A Fourier hologram or a computer-generated hologram, referred to as a kinoform, with a concealed feature, can also act as a matt structure. Their task is to project a concealed feature in reflection or transmission.

On both sides, as viewed in reflection or in incident light, the security element according to the invention has items of information or items of sub-information which are respectively generated only by one of the diffractive relief structures. That is embodied by at least a part of the relief structures being optically decoupled from each other so that particularly sophisticated and interesting optical effects can be produced independently of each other on both sides of the security element.

As already mentioned hereinbefore it is particularly preferred if the first and second information differ from each other in at least region-wise manner. A distinction in respect of the relief structures can be afforded by the profile shape, the spatial frequency and/or the azimuth angle or also by parameters of stochastic structures such as matt structures, such as for example the roughness depth, correlation length and so forth. Thus for example a numerical value can be produced by the first relief structure, as the first item of information, while a portrait produced by the second relief structure as the second item of information becomes visible after the security element is turned over.

It is however equally possible for a numerical value to be produced as the first item of information by the first relief structure while, after the security element is turned over, a numerical value which is produced as the second item of information by the second relief structure becomes visible in a representation which is correct in relation to sides and/or correct in relation to position (that is to say not upside down), the first and second items of information being the same.

It is further possible that a coloured numerical value is produced against an achromatic background as the first information by the first relief structure and, after the security element is turned over horizontally or vertically, an achromatic numerical value produced by the second relief structure as the second item of information is visible against a coloured background.

It is particularly preferred if the first reflection layer completely covers the second information generated by the second relief structure and optionally further generated items of information and if the second reflection layer completely covers the first information generated by the first relief structure and optionally further generated items of information. Therefore the security element provides items of information which are independent of each other on its two sides as the first and second relief structures are completely optically decoupled from each other.

It has proven to be particularly advantageous if the structure layer has the diffractive first relief structure on a first side and the diffractive second relief structure on a second side, wherein the first side adjoins the first reflection layer and the second side adjoins the second reflection layer.

Preferably the first and second reflection layers are arranged predominantly or completely in congruent relationship, viewed perpendicularly to the plane of the structure layer. The conformity of the extent in relation to surface area and the position of the two reflection layers relative to each other on the structure layer provides that particularly attractive security elements can be produced and optical decoupling of the first relief structure from the second relief structure can be implemented in a simple fashion. Particularly preferred in that respect are reflection layers which are opaque as viewed at least in incident light and in particular in incident light and in transmitted light, or which are backed with at least one opaque auxiliary layer.

Ideally the first reflection layer, when facing towards the viewer, forms a front view of at least one graphic motif, wherein the front view shows the first information generated by the first relief structure, and the second reflection layer when facing towards the viewer forms a rear view of the at least one graphic motif, wherein the rear view shows the second information generated by the second relief structure. The graphic motif can form the main motif of the security element, that above all is conspicuous to a viewer, or it can form a less conspicuous background motif which is combined with further, more conspicuous representations. In that respect, those representations in the front view and the rear view can differ markedly.

In such an embodiment the security element according to the invention presents a front view of a graphic motif and, after the security element is turned over, the rear view of that graphic motif. By virtue of the perfect conformity—as viewed perpendicularly to the plane of the structure layer—in regard to extent in respect of surface area and position of the first reflection layer with respect to the second reflection layer, a viewer looks only onto the first reflection layer in the region of the front view and only onto the second reflection layer in the region of rear view. A combination of the first and second reflection layers is not visible from any side of the security element. Thus, particularly when using the same materials for forming the first and second reflection layers, the viewer cannot see that this involves two separate reflection layers which are in different planes of the security element. Preferably the graphic motif is opaque in incident light and in particular in incident light and in transmitted light, in which respect it will be noted however that the overall impression of the security element remains transparent to the viewer when viewed in a transillumination situation.

In general terms there can be filigree printing in transparent regions of the security element without substantially impairing the transparency thereof.

If different first and second relief structures are used in the region of the graphic motif, the optical decoupling of the relief structures by means of the two reflection layers and optionally with the aid of one or more opaque auxiliary layers means that different items of information can be read off in the front view from in the rear view so that the viewer has the impression that this involves a three-dimensional object which is integrated into the security element and which provides the graphic motif.

A security element of that kind is difficult to imitate as arranging first and second reflection layers in perfect register relationship with each other is technically demanding. Thus the human eye can already distinguish two separate reflection layers if, as viewed perpendicularly to the plane of the structure layer, there is a spacing between the contour of the first reflection layer and the contour of the second reflection layer of >5 µm if the reflection layers differ in respect of colour and/or adjoining relief structure.

It has proven advantageous if the at least one image or graphic motif is composed of image or graphic elements which are opaque when viewed at least in incident light and transparent image or graphic elements, wherein the image elements which are opaque at least in incident light of the front view are formed by the first reflection layer and optionally the at least one first opaque auxiliary layer, wherein the image elements which are opaque at least in incident light of the rear view are formed by the second reflection layer and optionally the at least one second opaque auxiliary layer, and wherein the transparent image elements are formed by transparent regions of the at least one structure layer, optionally in combination with at least one further transparent layer.

That makes it possible to produce particularly high-quality and aesthetically attractive security elements having interesting graphic motifs which are difficult to imitate. In that respect the image elements which are opaque at least as viewed in incident light are opaque in particular as viewed in incident light and in a transillumination situation. In that respect the individual image elements which are opaque at least when viewed in incident light preferably involve an extent in respect of surface area in the range of 1 µm$^2$ to 400 mm$^2$, in particular in the range of 1 µm$^2$ to 2500 µm$^2$. In particular the minimum extent of an opaque image element in one direction corresponds to at least a mean spacing between the first and second reflection layers.

The opaque image elements can enclose or define transparent image elements, for example in the form of a frame or grating, and/or can be surrounded by a transparent image element and/or can be arranged in raster grid form, for example in the form of a line raster and/or a dot raster, whereby it is possible to produce half-tone images with a high level of resolution.

The extent in respect of surface area of an individual opaque image element can be selected to be so great that it is visible to the human eye or however so small that the resolution of the human eye is not sufficient to see it, for example in the form of raster dots for forming half-tone images. The preferred parameters of a rastering of that kind are set forth in greater detail hereinafter.

It has proven desirable if the at least one graphic motif is a figurative representation, a portrait, an alphanumeric character, a text, a graphic pattern, a symbol or a logo. In that respect the term figurative representation is used to denote a representation from the fields of flora, fauna, technology, architecture, sport or the like. A combination of different graphic motifs, for example a portrait with text and so forth has also proven desirable.

A reflection layer or an image element formed therefrom is referred to as being opaque in a transillumination mode when the optical density is >1 in the visible wavelength range in transillumination mode.

It has proven to be desirable if the at least one first opaque auxiliary layer and/or the at least one second opaque auxiliary layer is/are formed by at least one metal layer and/or at least one printing ink layer and/or at least one opaquely coloured lacquer layer which can also be a photoresist layer and/or opaque regions of the structure layer.

The first and/or second reflection layer is/are formed by at least one metal layer and/or at least one dielectric layer.

Besides the structure layer which is transparent at least in region-wise manner the security element can have at least one further transparent layer or layer succession which can optionally also be coloured transparent and which can be present on the security element either in region-wise manner or over the full surface area involved. The further transparent layer or layers concerned can be lacquer layers, plastic layers or films, dielectric layers, metallic thin films of particularly small layer thickness, thin-film interference layer stacks with viewing angle-dependent interference colour change effect or liquid crystal layers.

In an arrangement with a transparent cholesteric liquid crystal layer with a colour change effect or a transparent thin-film interference layer stack with a viewing angle-dependent interference colour change effect at least in transparent regions of the security element, the respective colour effect appears to a more greatly emphasised degree if the security element is viewed against a dark background.

In transparent regions of the security element there can be a transparent hologram or Kinegram® which is generated by the first and/or second relief structure and/or there can be a viewing angle-dependent colour change effect.

It has proven advantageous if optionally present transparent lacquer layers, plastic layers or films of the security element and also the structure layer of the security element contain luminescent or photochromic substances which are colourlessly transparent under normal illumination but which exhibit a specific colour of their own upon being excited for example with IR or UV radiation.

It has proven advantageous if the first and second reflection layers do not differ in respect of material and/or colour. Preferably the first and second reflection layers are of the same layer thickness in that case.

Thus the first and second reflection layers are preferably formed from the same metal/metal alloy, in particular aluminium, chromium, copper, gold or silver, or the same dielectric material, in particular a transparent material with a high refractive index such as ZnS, $TiO_2$ and so forth.

It is however proven to be equally advantageous if the first and second reflection layers differ in respect of material and/or colour. Thus, the first reflection layer is preferably formed from metal or a metal alloy. The second reflection layer is then preferably formed from a metal/metal alloy of a differing colour or from a dielectric layer. A different colour effect at two reflection layers of the same material can alternatively also be generated by one or both reflection layers, on the side thereof that is towards the viewer, being covered with a coloured transparent layer.

It has proven desirable if the structure layer is of a layer thickness in the range of 0.2 to 15 µm, in particular in the range of 0.3 to 3 µm. When the structure layer is of such a structure thickness, the human eye does not see that the first and second reflection layers are disposed on different planes within the security element, in which respect differences in depth of up to 0.1 mm cannot be perceived with a naked human eye. It is to be generally noted in that respect that the layer thickness of the structure layer is greater than the sum of the maximum structure depths of the first and second relief structures in order to exclude the relief structures influencing each other.

Preferably the structure layer is overall transparent, and in particular is colourlessly transparent.

It has proven advantageous if the security element when viewed in a transillumination situation has, in the region of at least one of the reflection layers, visibly differently transmissive regions which exhibit further information, in particular in the form of a pattern, text, image, portrait, logo or the like. That can be achieved in that one or more reflection layers is/are formed with small openings which cannot be seen by the human eye when viewed in incident light and/or are of differing thicknesses so that, when viewed in a transillumination situation, visible light can pass at least region-wise through the security element in the region of the reflection layer or layers, in particular in such a way that the further information can be seen. If two or more reflection layers are superimposed, perpendicularly to the plane of the structure layer as viewed in transmitted light, the transmission of each reflection layer is to be locally suitably adjusted so that visible transmission can still be achieved at the security element optionally also in the region of the mutually superposed reflection layers.

It is preferred if a reflection layer which appears opaque in incident light has transparent regions and/or openings whose dimensions, at least in one direction, are below the resolution of the human eye, that is to say smaller than about 0.3 mm. Particularly preferred are openings whose dimensions, at least in one direction, are in the range of 1 to 250 µm, in particular in the range of 2 to 100 µm, and in particular in the range of 5 to 80 µm. Transparent regions or openings of that kind are invisible to the human eye in incident light, but can be seen without any problem in transmitted light, by virtue of the increased transmission of light.

It has further proven to be advantageous if a reflection layer which appears opaque in incident light has transparent regions and/or openings, wherein the mean density in relation to surface area of the transparent regions or openings in the opaque layer is <10%. Transparent regions or openings of that kind are also substantially invisible to the human eye in incident light, but can be seen without any problem in transmitted light, by virtue of the increased transmission of light.

It is also advantageous if a reflection layer which appears opaque in incident light has regions of differing layer thickness. The regions with different layer thicknesses can appear opaque throughout to the human eye in incident light, but regions of a smaller layer thickness can be distinguished without any problem from regions with a greater layer thickness in transmitted light, by virtue of the increased transmission of light.

In transparent regions which are perceived as being equivalent to a through opening in a reflection layer which appears opaque in incident light, the material used to form the reflection layer can be present in such a small layer thickness that it has no substantial or perceptible influence on the transmission properties of the security element.

In that respect, structuring of a reflection layer, or the formation of openings or transparent regions, can be effected in accordance with a process as set forth in DE 10 2004 042

136 A1. In that case the thickness of the layer is adjusted by the material for forming the layer being applied uniformly to a surface provided with diffractive surface structures, in which case a locally different effective layer thickness is produced in dependence on the depth-to-width ratio of the surface structures.

In the regions which appear opaque in incident light, a reflection layer can have in at least region-wise manner a layer thickness which changes continuously. Alternatively or in combination therewith, in the regions which appear opaque in incident light, a reflection layer can have at least region-wise a layer thickness which changes in step-wise fashion. Producing the differing layer thickness generates differing transmissivity or optical density, as viewed in a transillumination situation, and can also be implemented in accordance with a process as set forth in DE 10 2004 042 136 A1.

It has also proven to be advantageous if the reflection layer which appears opaque in incident light has openings in such a way that that layer is structured in the form of a fine dot or line raster with a raster width of less than 300 μm. It is particularly preferred in that respect if the layer is structured in the form of an aperiodic dot or line raster. It has proven desirable if opaque image elements are used for the rastering, the dimensions of which, at least in one direction, are below the resolution of a human eye, that is to say smaller than about 0.3 mm. Particularly preferred are opaque image elements whose dimensions, at least in one direction, are in the range of 1 to 250 μm, particularly in the range of 2 to 100 μm and in particular in the range of 5 to 80 μm.

In that respect the term "dot" is used to denote not only circular pixels but also other geometrical shapes such as triangular, rectangular and elliptical pixels and so forth. Pixels in the form of symbols, graphic representations, alphanumeric characters or character sequences are also possible. In that respect the dots or lines are arranged either at a regular raster grid spacing or a locally or constantly changing raster grid spacing. Alternatively or in combination therewith the extent of the dots or lines, in respect of surface area, may vary.

Preferably the mean area coverage of the opaque image regions on the security element is less than 50% and is in particular in the range of 10 to 30%. As viewed in incident light the security element thus also appears to be partially transparent to the viewer and manifests different diffraction effects on both sides. At the same time, when viewed in the transillumination mode, transmission of the security element can be locally perceptibly different.

The object is attained for the security document insofar as the at least one security element is arranged in at least one transparent region of the security document or in overlapping relationship therewith. In that case the transparent region can be 100% transparent or can have opaque printing thereon or the like in up to 25% of its area, for example in the form of a filigree patterned printing which possibly extends into adjoining regions of the security document.

In that case the security element preferably forms what is referred to as a window element or is in the form of a security thread. A security element which is used as a window element can be used in that respect as an authentification sign or badge in order for example to make items of concealed information disposed on the security document visible. For that purpose there is for example a moiré pattern on the security document, which contains concealed items of information which first become visible when the moiré pattern is superimposed with the authentification badge. For that purpose the security document is for example folded in order to bring the authentification badge into overlapping relationship with the pattern or two security documents are used for mutually reading out the concealed information.

It has proven advantageous if the security document has a carrier substrate which is translucent or which is opaque when viewed in incident light and in transmitted light and there is a window opening in the carrier substrate in the at least one transparent region so that the at least one security element can be arranged in the window opening or extending thereover. The security element can accordingly be recognised from both sides of the security document.

It has further proven to be desirable if the security document has a transparent carrier substrate in particular of PVC, PET or PC, and the at least one security element is arranged on or embedded in the carrier substrate. Here in addition there can be one or more opaque colour layers or films which region-wise cover the carrier substrate on one or both sides, although they cut out the transparent region with the at least one security element. It is also possible to use a carrier substrate which is transparent in region-wise manner and in the transparent regions of which the at least one security element is arranged or embedded.

A security element according to the invention, in the form of a security thread, can however also be embedded in a security document such as for example a banknote in such a way that the front side of the security thread is visible in portion-wise manner on one side of the security document and the rear side of the security thread is visible in portion-wise manner on the opposite side of the security document, wherein the security thread is not visible—at least when viewed in incident light—in the region of those portions on the respective opposite side of the security document. Accordingly, the portions of the security thread, which are visible on one side of the security document, are respectively covered on the rear side by the carrier substrate of the security document, for example consisting of paper.

It has proven to be advantageous if the security document has at least one transparent protection layer, which protects the security document inclusive of the at least one security element from mechanical damage and/or from other adverse effects, for example due to moisture. Preferably the security document has two transparent protection layers between which at least the carrier substrate and the at least one security element, optionally also further layers of the security document, are enclosed.

Ideally the security document is an identity card, a passport, a certificate, a bank card, a credit card, a telephone card, a banknote, a driving license, a visa or the like.

For a first process for the production of a security element according to the invention the object of the invention is attained by the following steps:

a) providing a transparent first replication layer;

b) forming a diffraction master relief structure on a first surface of the first replication layer;

c) forming the region-wise first reflection layer, optionally also at least one region-wise first opaque auxiliary layer, on the first surface;

d) forming the structure layer which is transparent in at least region-wise fashion by a second replication layer which is arranged on the first reflection layer and optionally the at least one first opaque auxiliary layer and regions which are free therefrom of the first surface;

e) forming the diffractive second relief structure on a second side of the structure layer; and f) forming the region-wise second reflection layer on the second side of the structure layer in a layer thickness, with which the second relief structure is shaped on the side, remote from the structure layer, of the second reflection layer.

That process makes it possible for the structure layer to be of a particularly thin configuration which is therefore not self-supporting. If the first replication layer is adapted to be detachable from the structure layer or is provided on a detachable carrier film, that provides a structure as is usual in the case of transfer films. Accordingly the security element can be integrated into a transfer film and applied to a security document by stamping. The first replication layer can however also be self-supporting or can be provided on a transparent carrier film, in which case the first replication layer and optionally the carrier film form a strong permanent composite assembly with the further layers of the security element so that the finished security element is present in the form of a laminating film.

It has proven desirable if the first reflection layer and/or the second reflection layer is/are opaque. Alternatively the first and/or the second reflection layer can be transparent and viewed perpendicularly to the plane of the structure layer at least one first and/or at least one second opaque auxiliary layer are arranged in congruent relationship with the transparent reflection layer or layers.

The object of the invention is further attained by a second process for the production of a security element according to the invention comprising the following steps:

g) providing a transparent structure layer;
h) forming the diffractive first relief structure on a first side and the diffractive second relief structure on a second side of the structure layer;
i) forming the at least region-wise first reflection layer and optionally at least one first opaque auxiliary layer on the first side of the structure layer; and
k) forming the at least region-wise second reflection layer and optionally at least one second opaque auxiliary layer on the second side of the structure layer.

That process is particularly suitable for working with self-supporting structure layers. It has proven advantageous in that respect if the first and second relief structures are formed simultaneously by stamping. That is effected for example by the self-supporting structure layer being conveyed through between two stamping rollers which are each provided with a respective surface relief so that the first and second relief structures are formed in the structure layer, with suitable contact pressure on the part of the stamping rollers and with suitable temperature control. In that respect it is possible to ensure correct register relationship of the two relief structures, in a particularly simple fashion. The finished security element is preferably in the form of a laminating film.

It has proven desirable in that respect if the at least one first and/or second opaque layer is formed by a procedure whereby the structure layer is region-wise exposed and a transparent colouring agent contained in the structure layer is converted into an opaque colouring agent only in the exposed regions.

It is particularly preferred if the relief structures, that is to say for the first process the master relief structure and the second relief structure and for the second process the first and second relief structures, are formed by stamping, in particular by thermal replication or UV replication. In the thermal replication opening, a heated stamping tool with a surface relief is pressed against a thermoplastic replication layer or thermoplastic structure layer and the desired relief structure is shaped. The UV replication operation involves using a UV-hardening lacquer into which the stamping tool is pressed and which at the same time is acted upon with UV radiation and hardened in order to shape a relief structure.

It has proven desirable if in step c) or in step i) of the respective process, the first reflection layer is applied over the full surface area to the first replication layer or the structure layer and same is then partially removed. Processes as have already been sufficiently described in WO 2006/084685 A2 are particularly suitable for that purpose. Further suitable processes for producing partially provided reflection layers are partially applying an etching medium by printing, or partially applying a protective lacquer by printing, with subsequent etching in an etching bath.

It is particularly preferred if a first photoresist layer is applied over the full surface area involved to the first reflection layer which is formed over the full surface area, the first photoresist layer is partially exposed and removed, the first reflection layer is removed by etching in the regions in which the first photoresist layer was removed and optionally the remaining regions of the first photoresist layer are removed or are used as a opaque auxiliary layer.

In that respect conventional exposure can be effected by way of an exposure mask or however it is possible to use a process for exposing the photoresist, as is described in WO 2006/084685 A2. Here, exposure of the first photoresist layer is effected through the first reflection layer, wherein partial exposure of the first photoresist layer is effected in dependence on the configuration and/or arrangement of the first relief structure.

It has further proven desirable if in step f) or step k) of the respective process the second reflection layer is applied over the full surface area and then partially removed. In particular the processes as have already been sufficiently described in WO 2006/084685 A2 are also suitable for that purpose.

It is particularly preferred if a second photoresist layer is applied over the full surface area to the second reflection layer provided over the full surface area, the second photoresist layer is partially exposed and removed, the second reflection layer is removed by etching in the regions in which the second photoresist layer was removed, and optionally the remaining regions of the second photoresist layer are removed. If the remaining regions of the photoresist layer are coloured transparent, colouring of the second reflection layer can be achieved thereby.

In this case also it is possible to effect conventional exposure by way of an exposure mask or however it is possible to use a process for exposure of the photoresist, which is similar to that described in WO 2006/084685 A2. In that case exposure of the second photoresist layer is effected through the first and second reflection layers, wherein partial exposure of the second photoresist layer is effected in dependence on the configuration and/or arrangement of the first relief structure and/or the second relief structure.

It is particularly surprising in that respect that specifically targeted, partial exposure of the second photoresist layer can not only be effected through a relief structure and a reflection layer, as is proposed in WO 2006/084685 A2, but exposure through two relief structures and two reflection layers which follow in succession in the beam path can also be utilised to provide for specifically targeted, partial exposure of the photoresist layer. In that respect the transmissivity for the exposure radiation in the beam path is the total of the radiation transmissivity of the first reflection layer and the radiation transmissivity of the second reflection layer.

BRIEF DESCRIPTION OF THE DRAWINGS

FIGS. 1a to 5b will describe the invention by way of example. In the drawings:

FIG. 1a shows a security element with a graphic motif which shows inter alia hot air balloons, FIGS. 5a to 5d show a further process for the production of a security element with opaque auxiliary layer in cross-section, and FIGS. 6a and 6b show security documents with a security element.

DETAILED DESCRIPTION OF THE INVENTION

Figure 1A:
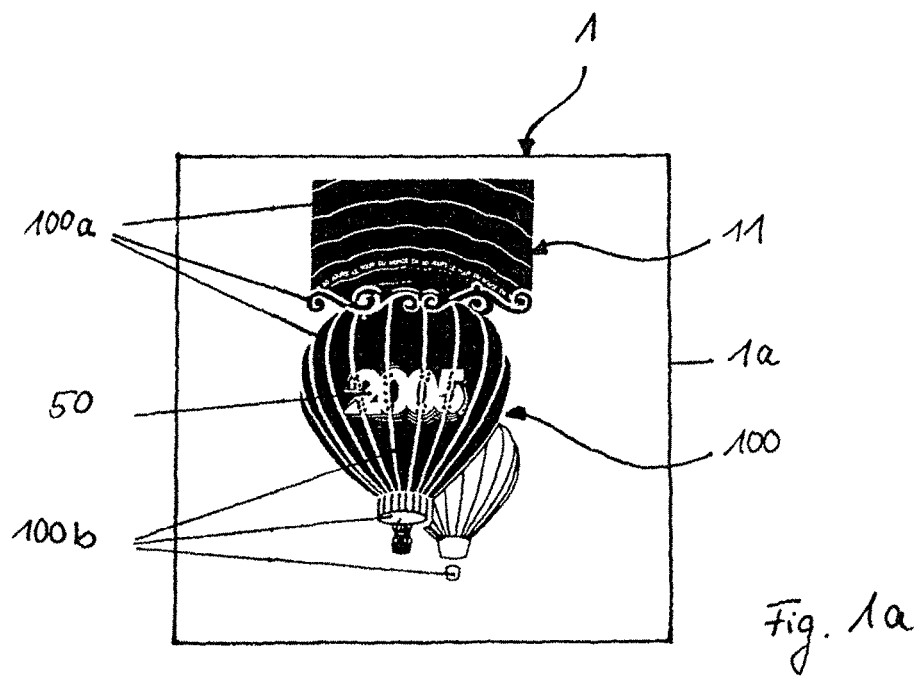

FIG. 1a shows a security element 1 with a graphic motif 100 which shows inter alia hot air balloons and further decorative elements. Disposed on a transparent structure layer 1a, facing towards the viewer, is the first reflection layer 11 comprising aluminium which is opaque when viewed in incident light and in a transillumination situation, the reflection layer 11 forming a front view of the graphic motif 100 with a plurality of opaque image elements 100a. The transparent image elements 100b are formed by the structure layer 1a and further transparent layers 40, 41, 1b, 20 (see FIG. 2i). The opaque image elements 100a further show a first holographic information 50 in the form of the number "2005" which is generated by a first diffractive relief structure 10a (see FIG. 2d). In that respect the first item of information 50 is invisible in the region of the thin transparent regions 100b in line form (position also indicated by means of dotted lines) within the balloon and in other respects is backed opaquely in the region of the opaque image elements 100a by the first reflection layer 11.

Figure 1B:
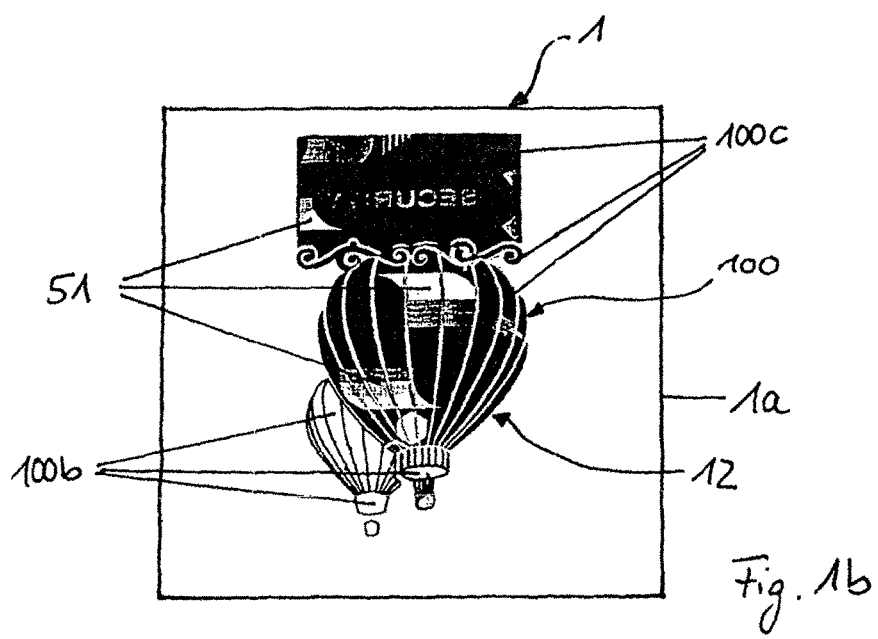
FIG. 1b shows the security element of FIG. 1a after being turned over.

FIG. 1b shows the security element 1 of FIG. 1a from the other side, showing the rear view of the graphic motif 100. Disposed on the transparent structure layer 1a, facing towards the viewer, is the second reflection layer 12 which consists of aluminium and which provides a front view of the graphic motif 100 with a plurality of opaque image elements 100c. The transparent image elements 100b are formed by the structure layer 1a and further transparent layers 1b, 20 (see FIG. 2i). The opaque image elements 100c show a second item of information 51 in the form of holograms, which is generated by a second diffractive relief structure 10b (see FIG. 2e). In that respect the second information 51 is invisible in the region of the thin transparent regions 100b in line form, within the balloon, and in other respects is opaquely backed in the region of the opaque image elements 100c by the second reflection layer 12.

In this case, as shown in FIG. 1a, when viewing the graphic motif 100 as a front view, only the first reflection layer 11 is visible, while when viewing the graphic motif 100 as a rear view, as shown in FIG. 1b, only the second reflection layer 12 is visible. As a result diffractive optically variable effects inclusive of the first item of information 50 of the first relief structure 10a are perceptible only in the front view of the graphic motif 100 and the diffractive optically variable effects inclusive of the second item of information of the second relief structure 10b are only perceptible in the rear view of the graphic motif 100. The first relief structure 10a is optically completely decoupled from the second relief structure 10b as the first and second reflection layers 11 and 12, viewed perpendicularly to the plane of the structure layer 1a, are arranged one behind the other in congruent relationship with the same extent in respect of surface area. The person viewing the security element 1 has the impression as though a three-dimensional metallic object were contained in the security element.

FIGS. 2a to 2i show a simplified view illustrating a process for the production of the security element 1 shown in FIGS. 1a and 1b.

Figure 2A:
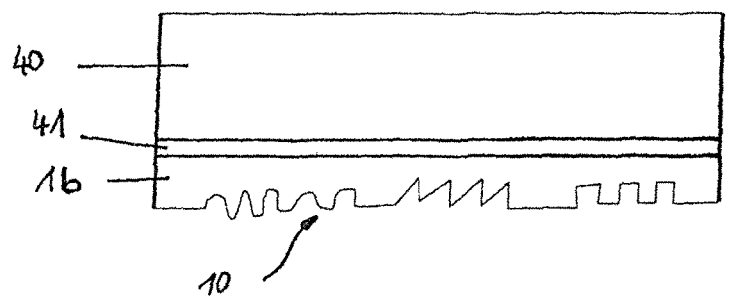
FIGS. 2a to 2i show a process for the production of the security element of FIGS. 1a and 1b in a simplified view.

Referring to FIG. 2a, arranged on a carrier film 40 is a release layer 41 which permits detachment of a security element 1 subsequently formed thereon. A carrier film is usually of a thickness in the range of 12 μm to 100 μm. A transparent first replication layer 1b in the form of a thermoplastic layer is applied to the release layer 41 which is usually formed from wax or silicone, and the replication layer 1b is stamped or embossed with a diffractive master relief structure 10 by a procedure whereby a profiled stamping tool (not shown here) is pressed under pressure and at elevated temperature against the first replication layer 1b.

Figure 2B:
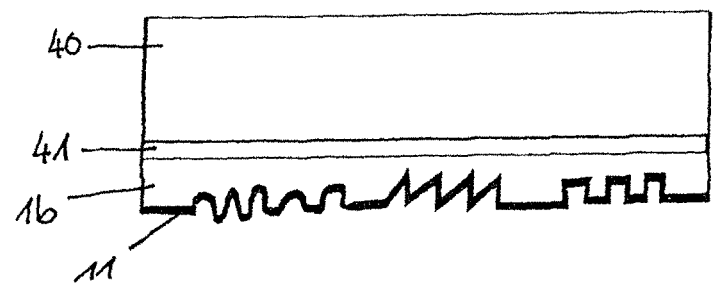

Referring to FIG. 2b, a first reflection layer 11 of aluminium is applied over the full surface area thereof to the first replication layer 1b, and covered with a photoresist layer (not shown here). The first reflection layer 11 is partially exposed by patterned exposure of the photoresist layer and partial removal thereof, and is removed by etching from the first replication layer 1b. Alternatively however it would also be possible to apply an etching-resistant lacquer layer in pattern form, by printing, and that lacquer layer protects the first reflection layer 11 in a subsequent etching procedure.

Figure 2C:
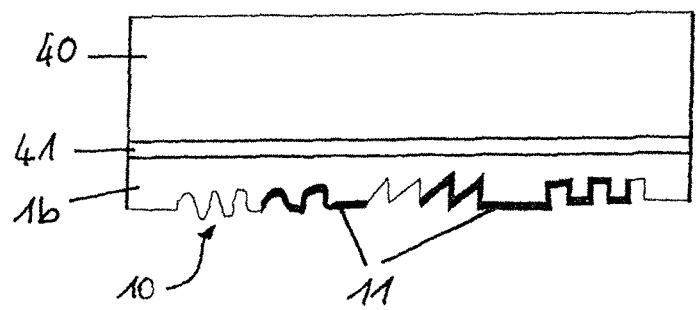

The result is shown in FIG. 2c. The first replication layer 1b is now only still partially covered with the first reflection layer 11.

Figure 2D:
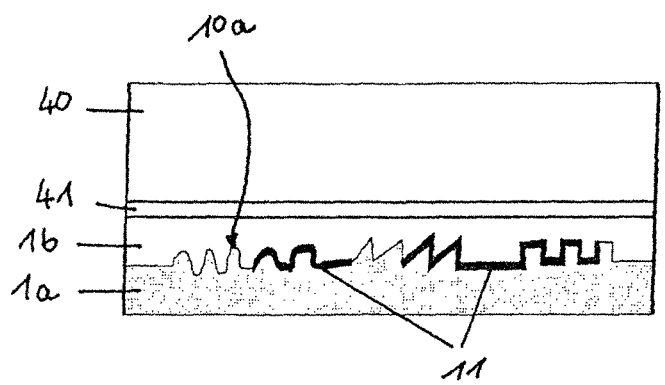

Referring to FIG. 2d, the transparent structure layer 1a is now formed over the full surface area involved, on the first reflection layer 11 and regions, which are free thereof, of the first replication layer 1b. In that case, the first diffractive relief structure 10a is produced on the side of the structure layer 1a, that is towards the first reflection layer 11.

Figure 2E:
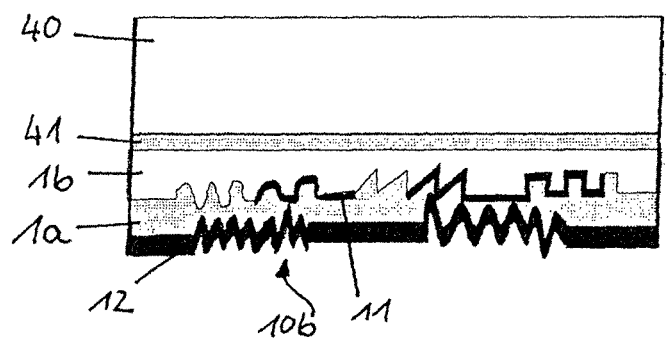

Referring to FIG. 2e, the structure layer 1a is now stamped or embossed with a second diffractive relief structure 10b on its side remote from the first reflection layer 11, and coated over its full area with a second reflection layer 12 of aluminium. The first and second relief structures 11, 12 are different in respect of their profile shape, orientation or spatial frequencies.

The operation of producing the second relief structure can be effected independently of the first relief structure. It will be noted however that alignment or registration of the second relief structure with respect to the first relief structure should be effected at least in one direction, in which respect a deviation from the desired registration, or the register error, should be <2 mm, in particular <1 mm.

Figure 2F:
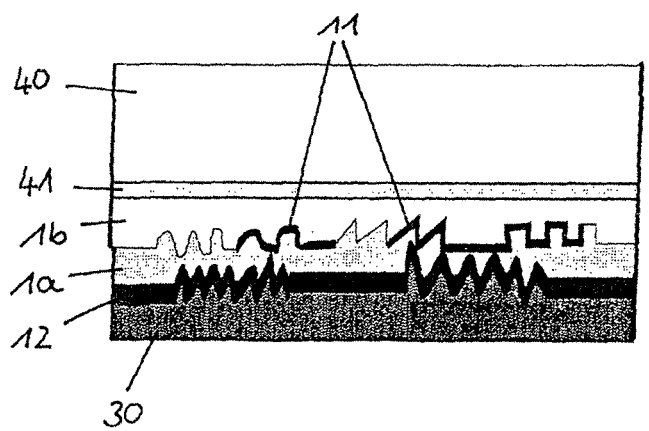

Referring to FIG. 2f, a photoresist layer 30 is applied over the full area to the second reflection layer 12 and exposed in pattern form, with exposure being effected in register relationship with the first reflection layer 11 which is provided in region-wise manner. Preferably in that case the first reflection layer 11 is used as an exposure mask for the photoresist layer 30.

Alternatively, the photoresist layer 30 can also be formed in pattern form on the first reflection layer 11 or only region-wise exposure can be effected, for example by way of an electronically actuable mask or by means of a laser scanner, in order to produce individual identifications, for example in the form of partially transparent regions which can be seen in transmitted light.

Figure 2G:
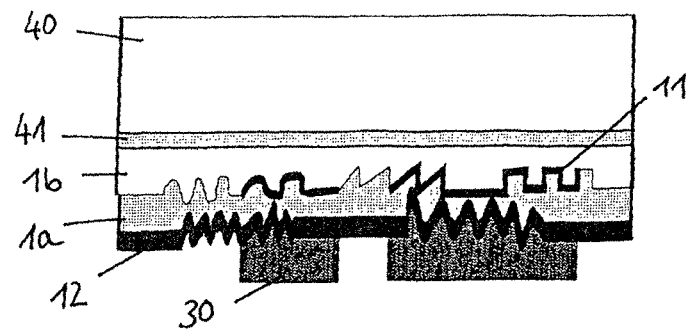

Referring to FIG. 2g, the photoresist layer 30 is partially removed and all that then remain are the regions of the photoresist layer 30 on the second reflection layer 12, which as viewed perpendicularly to the plane of the structure layer 1a, are arranged in congruent relationship with the first reflection layer 11.

Figure 2H:
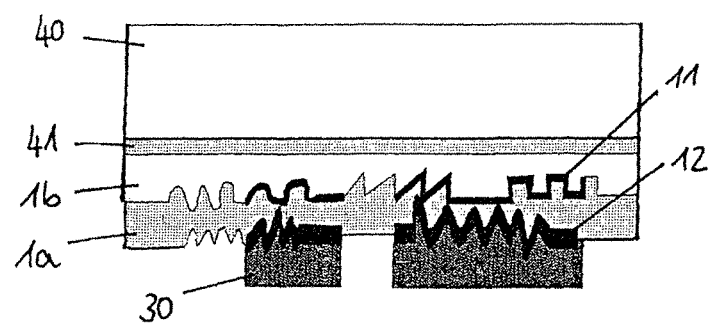
Figure 2I:
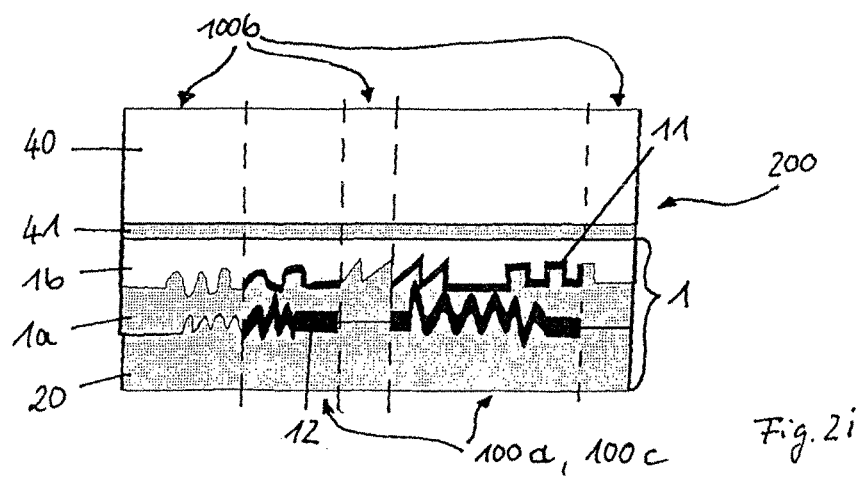

Referring to FIG. 2h, the exposed regions of the second reflection layer 12 are now removed by etching from the structure layer 1a.

The remains of the photoresist layer 30 are then removed and a transparent adhesive layer 20 is applied over the full surface area to the second reflection layer 12 and regions, which are free therefrom, of the structure layer 1a. This now provides a transfer film 200 having the carrier film 40, the release layer 41 and the security element 1 which can be applied to a security document by means of stamping and can be fixed thereon by means of the adhesive layer 20. The carrier film 40 and the release layer 41 are then pulled off the security element 1. Insofar as this arrangement has a transparent release layer 41, the latter can also remain on the security element 1 so that only the carrier film 40 is removed. Image elements 100b which are now transparent in transillumination can be seen on the security element 1, beside opaque image elements 100a, 100c. Alternatively it is also possible to operate without a release layer 41 if the carrier film 40 can be detached from the first replication layer 1b without any problem.

If the security element is in the form of a laminating film it is highly stable by virtue of its greater thickness, and also self-supporting. Laminating films are suitable in particular for reliably and permanently covering or extending over window openings in security documents. In that respect, it is possible to use carrier films of up to some 100 µm in thickness to construct the security element and at the same time the spacing between the first and second reflection layers can be kept smaller than 15 µm or minimised.

Figure 3A:
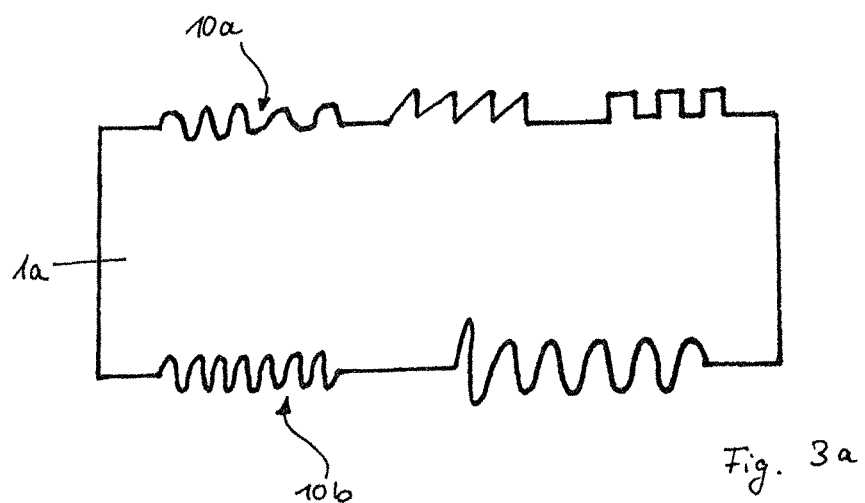
FIG. 3a shows a self-supporting structure layer with diffractive first and second relief structures.

FIG. 3a shows a self-supporting thermoplastic transparent structure layer 1a with a stamped or embossed diffractive first relief structure 10a and a diffractive second relief structure 10b, the first relief structure 10a and the second relief structure 10b differing from each other.

Figure 3B:
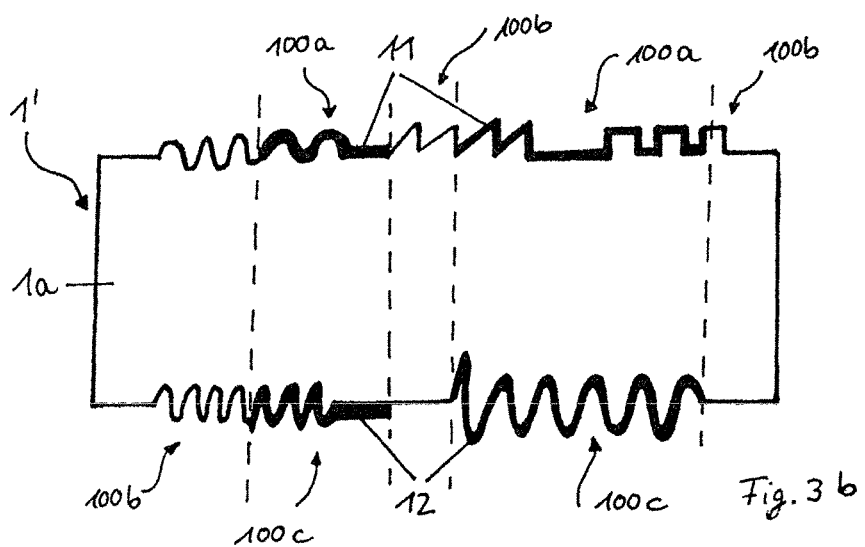
FIG. 3b shows a security element with a structure layer as shown in FIG. 3a, FIGS. 4a to 4g show a further process for the production of a security element with opaque auxiliary layer in cross-section.

FIG. 3b shows a security element 1' having a structure layer 1a as shown in FIG. 3a. The first relief structure 10a is arranged adjoining a region-wise first reflection layer 11 of gold while the second relief structure 10b is arranged adjoining a second reflection layer 12 of silver, which is provided in region-wise manner and in congruent relationship with the first reflection layer 11. When the security element 1' is viewed from the side on which the first reflection layer 11 is disposed, it is possible to see a graphic motif with golden, metallically reflecting, opaque image elements 100a and transparent image elements 100b. A first item of information which is generated by the first relief structure 10a is presented in the region of the opaque image element 100a. When the security element 1' is viewed from the side on which the second reflection layer 12 is disposed, it is possible to see the graphic motif as a rear view with silver, metallically reflecting, opaque image elements 100c and transparent image elements 100b. A second item of information which is generated by the second relief structure 10b is presented in the region of the opaque image elements 100c.

When using the same materials such as for example aluminium for forming the first and second reflection layers, it is possible for different colour effects also to be produced by one or both reflection layers being covered with a transparent coloured layer. If both the first and also the second reflection layer are each covered with such a layer on their side that is towards the viewer, those two layers can have the same or different colouring. An individual transparent coloured layer can also be coloured in region-wise fashion or in the form of a pattern, optionally also with different colours.

FIGS. 4a to 4g show a further process for the production of a security element having a first opaque auxiliary layer in the form of an opaquely coloured photoresist layer 30, in the form of a cross-section.

Figure 4A:
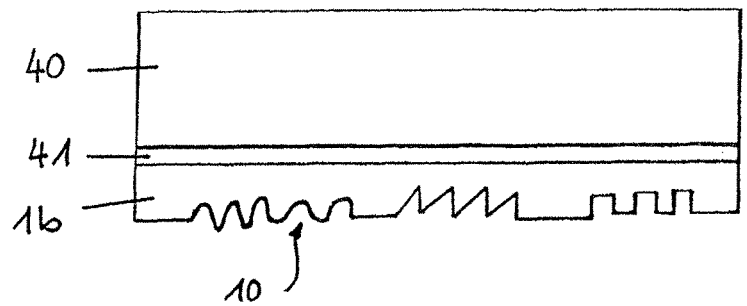
Figure 4B:
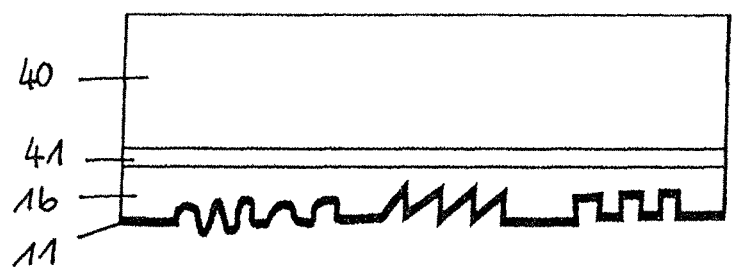
Figure 4C:
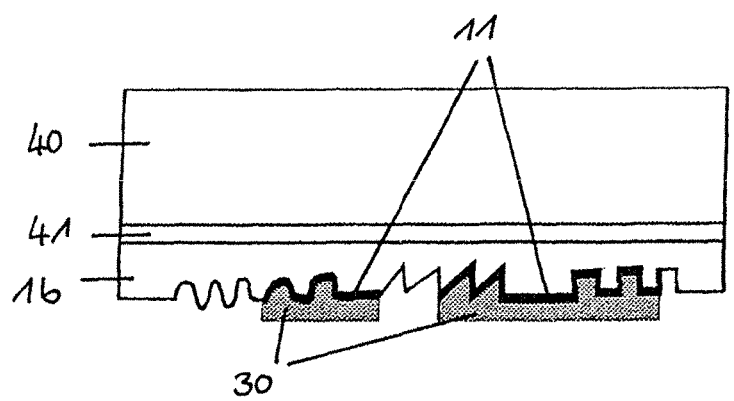
Figure 4D:
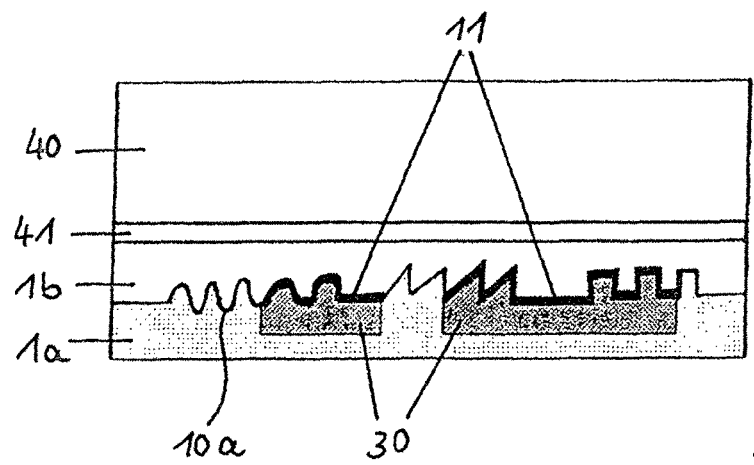
Figure 4E:
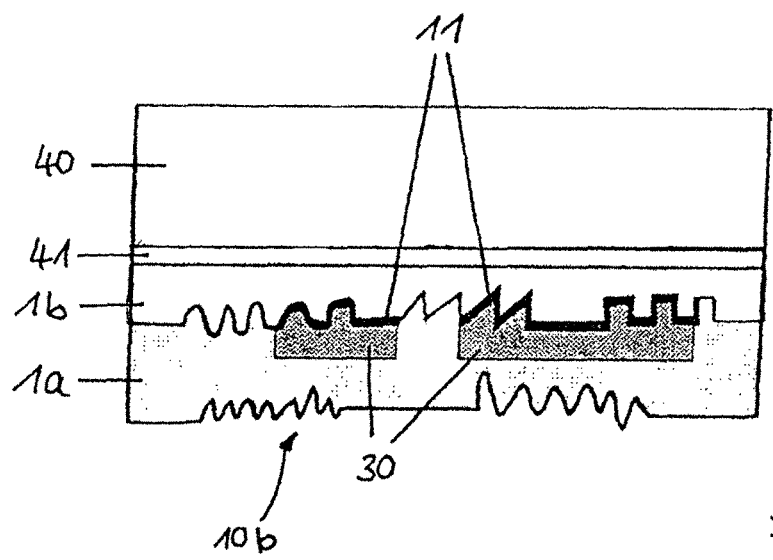
Figure 4F:
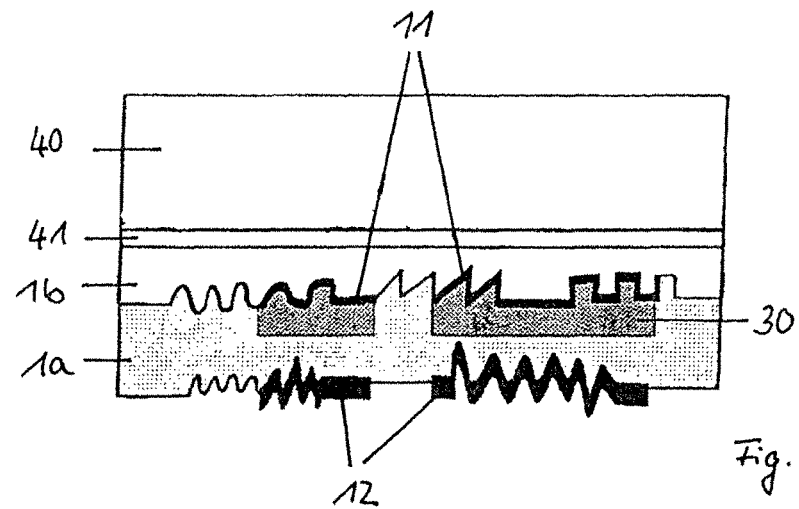
Figure 4G:
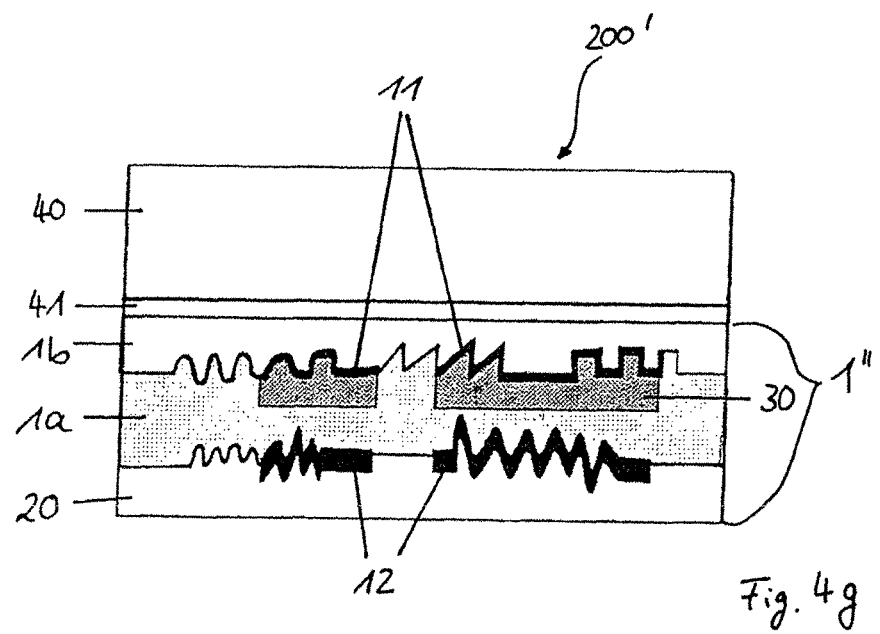

Referring to FIG. 4a there is a carrier film 40 of PET which can be detached from the security element 1" to be formed thereon (see FIG. 4g). Arranged on the carrier film 40 are a release layer 41 and a transparent first replication layer 1b which is embossed with a diffractive first relief structure 10a, on its side remote from the release layer 41.

Referring to FIG. 4b, a transparent first reflection layer 11 of ZnS is applied over the full surface area to the first replication layer 1b and a photoresist layer 30 which is coloured opaquely green is applied thereto over the full surface area, the photoresist layer is exposed in pattern form and removed in region-wise fashion. The coloured photoresist layer 30 is in particular of such a great layer thickness that there is no longer any relief structure at all on its side that is remote from the first replication layer 1b. There then follows an etching procedure in which the first reflection layer 11 is removed in the regions which are not covered and protected by the patterned photoresist layer 30 which forms a first opaque auxiliary layer.

The result of those process steps is shown in FIG. 4c. The first reflection layer 11 is now structured in pattern form and is in congruent relationship with the patterned coloured photoresist layer 30 or the opaque auxiliary layer respectively.

As an alternative to the described use of a photoresist layer, it is also possible to produce the opaque auxiliary layer by that layer being applied by printing in pattern form.

Referring to FIG. 4d, a transparent structure layer 1a is now formed over the full surface area, which covers the photoresist layer 30 and regions which are free therefrom of the first replication layer 1b.

As shown in FIG. 4e the structure layer 1a is stamped with a diffractive second relief structure 10b which differs from the first relief structure 10a.

A transparent second reflection layer 12 of ZnS is now applied over the full surface area to the structure layer 1a having the second relief structure 10b. On its side remote from the structure layer 1a, the second reflection layer 12 is covered with a further photoresist layer and the latter is exposed in pattern form, the opaque auxiliary layer functioning as an exposure mask. The further photoresist layer is removed in region-wise manner, the second reflection layer 12 is correspondingly exposed and the exposed regions are then removed by etching. After removal of the remains of the further photoresist layer, the result is an arrangement as shown in FIG. 4f.

Referring to FIG. 4g, the arrangement now has a transfer film 200' which includes the security element 1" and the carrier film 40 which is detachable therefrom. An adhesive layer 20 can optionally be disposed on the side of the security element 1", that is remote from the carrier film 40, in order to apply the security element 1″ to a security document by hot stamping thereof.

When the security element 1″ formed is viewed in such a way that the first reflection layer 11 is towards the viewer, the first item of information which is generated by the first relief structure 10*a* in conjunction with the first reflection layer 11 presents itself against the opaquely green coloured photoresist layer 30 in pattern form, or the first opaque auxiliary layer. The optically variable effects which are formed by the second relief structure 10*b* in conjunction with the second reflection layer 12 are completely covered by the first opaque auxiliary layer. If the security element 1″ formed is viewed in such a way that the second reflection layer 12 is towards the viewer, the second item of information which is generated by the second relief structure 10*b* in conjunction with the second reflection layer 12 presents itself against the patterned opaquely green coloured photoresist layer 30 or first opaque auxiliary layer. The optically variable effects of the first relief structure 10*a* which are formed by the first relief structure 10*a* in conjunction with the first reflection layer 11 are completely covered by the first opaque auxiliary layer. With suitable positioning of the first and second reflection layer, the at least one opaque auxiliary layer and the first and second relief structures relative to each other, it is accordingly possible to produce high-grade and attractive security elements which are particularly difficult to imitate.

FIGS. 5*a* to 5*d* show a further process for the production of a security element having a first opaque auxiliary layer in the form of a partially opaquely coloured structure layer in cross-section.

Figure 5A:
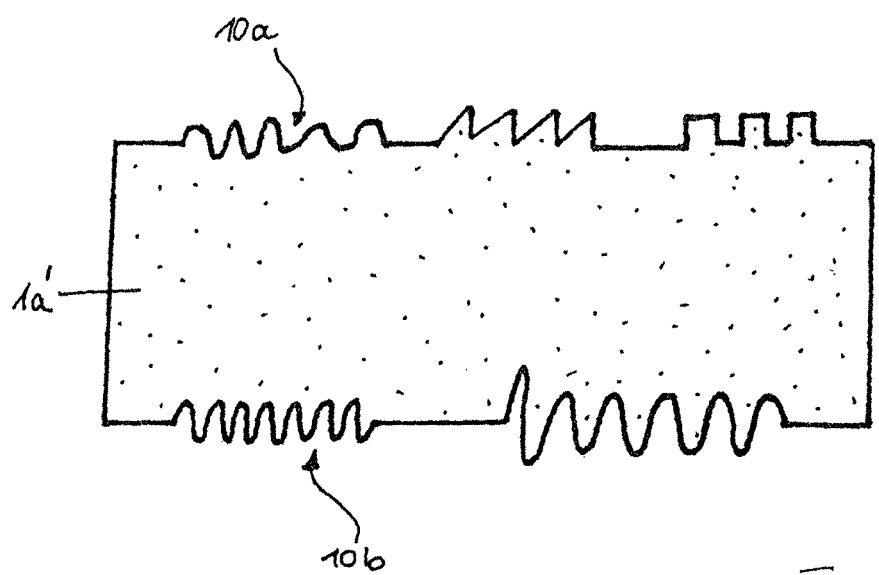

Referring to FIG. 5*a*, the arrangement has a self-supporting transparent structure layer 1*a*' which contains a transparent dye or colouring agent which becomes opaquely coloured or black upon being irradiated. The structure layer 1*a*' is embossed with a diffractive first relief structure 10*a* on a first side and a diffractive second relief structure 10*b* on its second side.

Figure 5B:
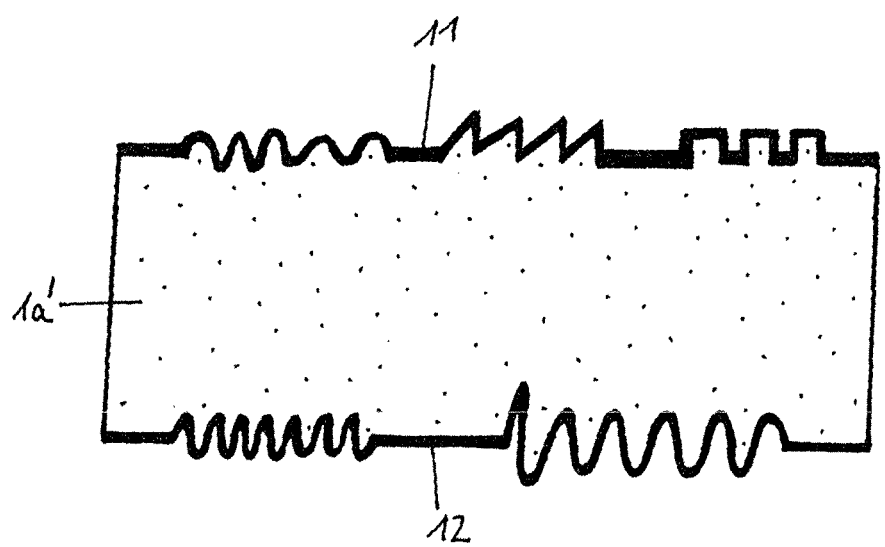
Figure 5C:
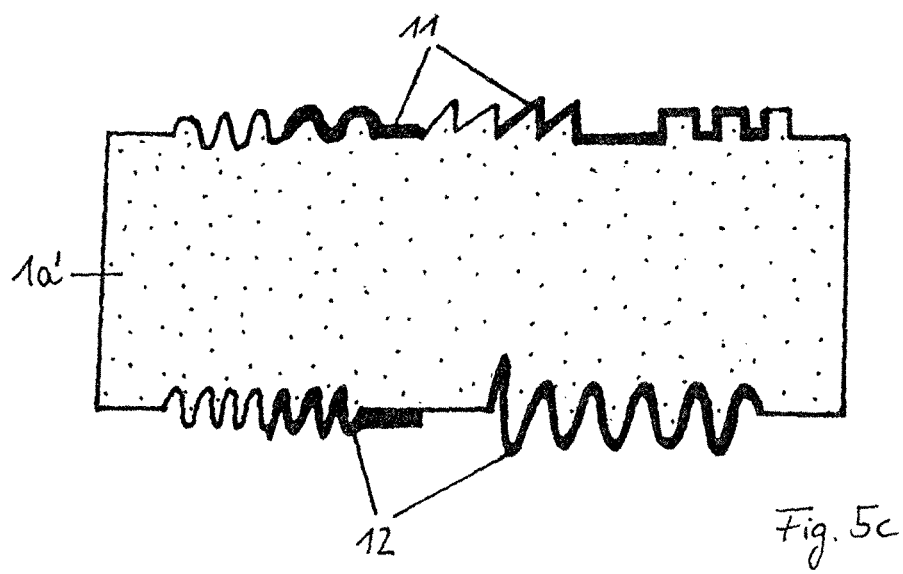

A transparent reflection layer 11, 12 of ZnS is applied over the full surface area to the structure layer 1*a*' on each of the two sides (see FIG. 5*b*). An etching paste is applied thereto on both sides in pattern form, the etching paste dissolving or region-wise removing the subjacent regions of the respective reflection layers 11, 12. The result of those process steps is shown in FIG. 5*c*. The first reflection layer 11 is now structured in pattern form and is in congruent relationship with the second reflection layer 12 which is structured in pattern form.

Figure 5D:
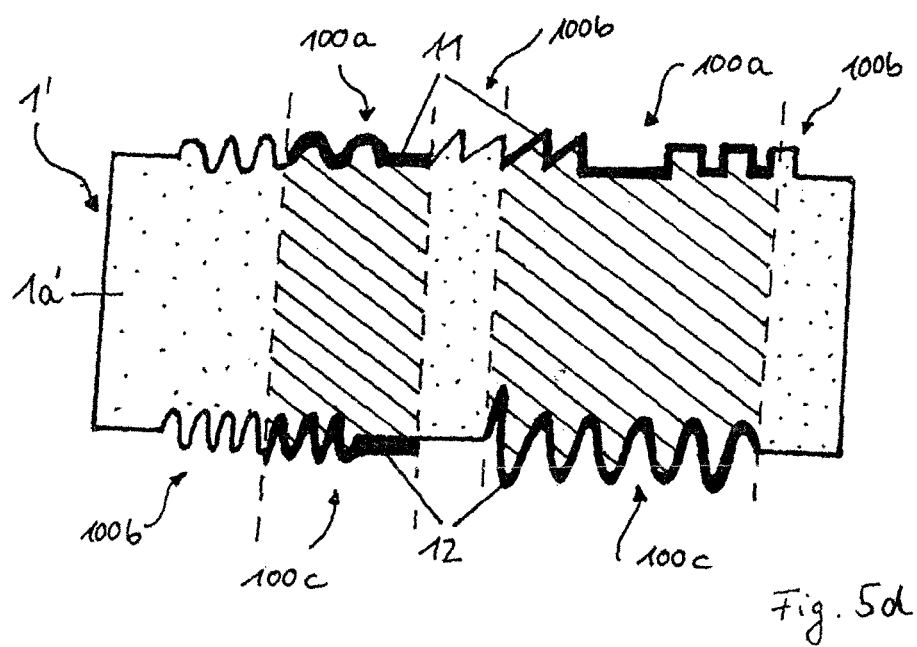
Figure 66:
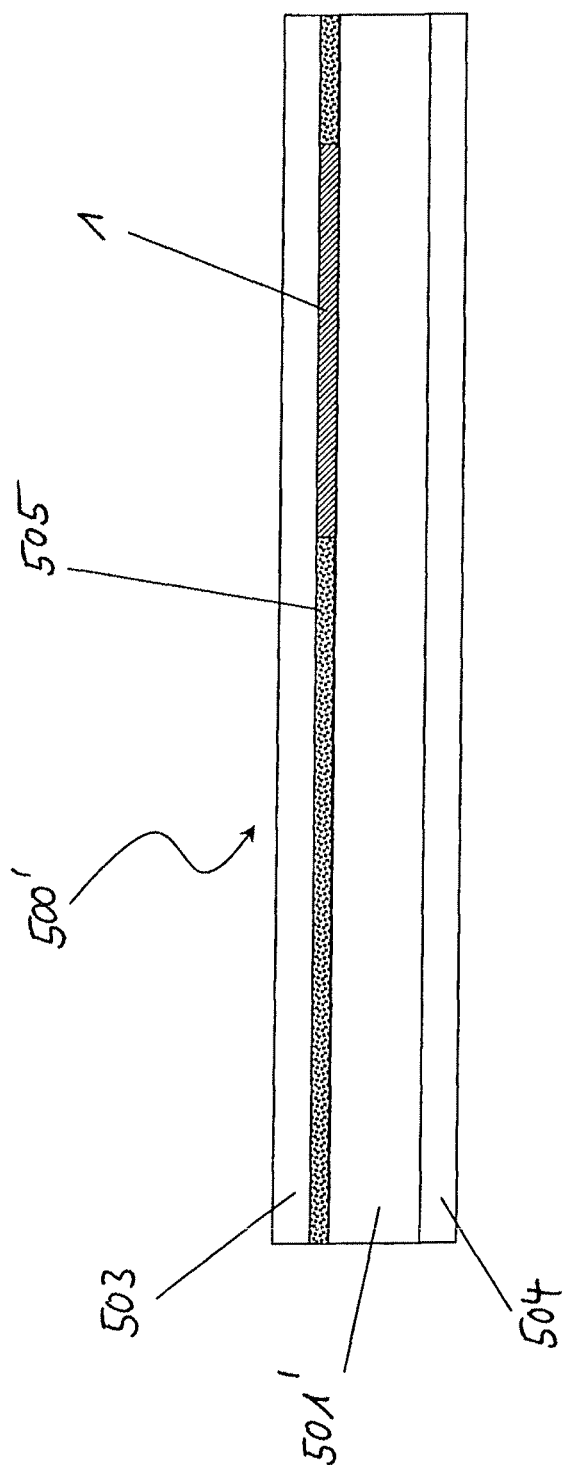

The transparent structure layer 1*a*' is now exposed in pattern form, for example by way of a mask. The transparent colouring agent in the structure layer 1*a*' is irradiated in the regions 100*a*, 100*c* and thereby becomes coloured so that the structure layer 1*a*' appears opaque after exposure in the regions 100*a*, 100*c* and forms a first opaque auxiliary layer. The regions 100*b* of the structure layer 1*a*' in contrast remain transparent. As shown in FIG. 5*d*, there is now a security element 1' which for example can be applied to a security document by means of an adhesive layer.

If the security element 1' formed is viewed in such a way that the first reflection layer 11 is towards the viewer, the first item of information which is generated by the first relief structure 10*a* in conjunction with the transparent first reflection layer 11 presents itself against opaquely coloured regions of the structure layer 1*a*' or the first opaque auxiliary layer. The optically variable effects which are formed by the second relief structure 10*b* in conjunction with the second reflection layer 12 are completely covered by the first opaque auxiliary layer. If the security element 1' formed is viewed in such a way that the second reflection layer 12 faces towards the viewer, the second item of information which is generated by the second relief structure 10*b* in conjunction with the transparent second reflection layer 12 presents itself against the structure layer 1*a*' which is opaquely coloured in pattern form, or the first opaque auxiliary layer. The optically variable effects of the first relief structure 10*a* which are formed by the first relief structure 10*a* in conjunction with the first reflection layer 11 are completely covered by the first opaque auxiliary layer.

With suitable position of the first and second reflection layers, the at least one opaque auxiliary layer and the first and second relief structures relative to each other accordingly it is possible to produce high-grade attractive security elements which are particularly difficult to imitate.

FIG. 6*a* shows a security document 500 with a security element 1 according to the invention, in cross-section. The security document 500 has a carrier substrate 501 of paper with a window opening 502 as a transparent region. Here the security element 1 extends over the window opening 502 or alternatively is arranged in the window opening, for example between two paper layers of the carrier substrate 501. The security document 500 also optionally has two colourlessly transparent protection layers 503, 504 which enclose the carrier substrate 501 and the security element 1 between them and protect them from mechanical loadings and moisture. The security element 1 can thus be viewed from both sides in the transparent region of the security document 500.

FIG. 6*b* shows a further security document 500' with a security element 1 according to the invention, in cross-section. The security document 500' has a transparent carrier substrate 501', for example of PET, PVC or PC, and an opaque printed ink layer 505. The security element 1 is applied to the carrier substrate 501' or alternatively is laminated thereinto, and is surrounded by the opaque printed ink layer 505. In that case, the security element 1 could also be arranged in partially overlapping relationship with the opaque printed ink layer 505. The security element 1 can be formed substantially from the same material as the carrier substrate 501'. The security document 500' further optionally has two colourlessly transparent protection layers 503, 504 which enclose the carrier substrate 501', the printed ink layer 505 and the security element 1 between them and protect them from mechanical loadings and moisture. The security element 1 can thus be viewed from both sides in the transparent region of the security document 500'.

The invention claimed is:

1. A process for the production of a security element, the process comprising the following steps:
 a) providing a transparent first replication layer;
 b) forming a diffraction master relief structure on a first surface of the first replication layer;
 c) forming a region-wise first reflection layer and at least one region-wise first opaque auxiliary layer, on the first surface;
 d) forming a structure layer which is transparent in at least region-wise fashion by a second replication layer having a first surface which is arranged on the first reflection layer and the at least one first opaque auxiliary layer and regions which are free therefrom of the first surface;
 e) forming a diffractive second relief structure on a second surface of the structure layer; and
 f) forming a region-wise second reflection layer on the second surface of the structure layer in a layer thickness, with which a side of the second reflection layer remote from the structure layer is shaped with the second relief structure, wherein the first and/or the second reflection layer is transparent when viewed perpendicularly to a plane defined by the structure layer, and the at least one opaque auxiliary layer is arranged in congruent relationship with the transparent reflection layer or layers.

2. A process according to claim 1, wherein the first reflection layer and/or the second reflection layer is/are opaque.

3. A process for the production of a security element, the process comprising the following steps:
 a) providing a transparent structure layer;
 b) forming a diffractive first relief structure on a first side and a diffractive second relief structure on a second side of the structure layer;
 c) forming an at least region-wise first reflection layer and at least one first opaque auxiliary layer on the first side of the structure layer; and
 d) forming an at least region-wise second reflection layer and at least one second opaque auxiliary layer on the second side of the structure layer,
 wherein the relief structures are formed by thermal replication or UV replication.

4. A process according to claim 3, wherein the first and second relief structures are formed simultaneously by stamping.

5. A security element formed by a process according to claim 3.

6. A process for the production of a security element, the process comprising the following steps:
 a) providing a transparent first replication layer;
 b) forming a diffraction master relief structure on a first surface of the first replication layer;
 c) forming a region-wise first reflection layer and at least one region-wise first opaque auxiliary layer, on the first surface;
 d) forming a structure layer which is transparent in at least region-wise fashion by a second replication layer having a first surface which is arranged on the first reflection layer and the at least one first opaque auxiliary layer and regions which are free therefrom of the first surface;
 e) forming a diffractive second relief structure on a second surface of the structure layer; and
 f) forming a region-wise second reflection layer on the second surface of the structure layer in a layer thickness, with which a side of the second reflection layer remote from the structure layer is shaped with the second relief structure,
 wherein the at least one opaque auxiliary layer is formed by the structure layer being exposed region-wise and by a transparent colouring agent contained in the structure layer being converted into an opaque coloured colouring agent in the exposed regions.

7. A process for the production of a security element, the process comprising the following steps:
 a) providing a transparent first replication layer;
 b) forming a diffraction master relief structure on a first surface of the first replication layer;
 c) forming a region-wise first reflection layer on the first surface;
 d) forming a structure layer which is transparent in at least region-wise fashion by a second replication layer having a first surface which is arranged on the first reflection layer;
 e) forming a diffractive second relief structure on a second surface of the structure layer; and
 f) forming a region-wise second reflection layer on the second surface of the structure layer in a layer thickness, with which a side of the second reflection layer remote from the structure layer is shaped with the second relief structure,
 wherein the relief structures are formed by thermal replication or UV replication.

8. A security element formed by a process according to claim 7.

9. A process for the production of a security element, the process comprising the following steps:
 a) providing a transparent first replication layer;
 b) forming a diffraction master relief structure on a first surface of the first replication layer;
 c) forming a region-wise first reflection layer on the first surface;
 d) forming a structure layer which is transparent in at least region-wise fashion by a second replication layer having a first surface which is arranged on the first reflection layer;
 e) forming a diffractive second relief structure on a second surface of the structure layer; and
 f) forming a region-wise second reflection layer on the second surface of the structure layer in a layer thickness with which a side of the second reflection layer remote from the structure layer is shaped with the second relief structure,
 wherein, in step c), the first reflection layer is applied over a full surface area, a first photoresist layer is applied over a full surface area of the first reflection layer, the first photoresist layer is partially exposed and removed in regions, the first reflection layer is removed by etching in the regions in which the first photoresist layer was removed and remaining regions of the first photoresist layer are removed or are used as a first opaque auxiliary layer.

10. A process according to claim 9, wherein exposure of the first photoresist layer is effected through the first reflection layer, wherein partial exposure of the first photoresist layer is effected in dependence on a configuration and/or arrangement of the first relief structure.

11. A process for the production of a security element, the process comprising the following steps:
 a) providing a transparent first replication layer;
 b) forming a diffraction master relief structure on a first surface of the first replication layer;
 c) forming a region-wise first reflection layer on the first surface;
 d) forming a structure layer which is transparent in at least region-wise fashion by a second replication layer having a first surface which is arranged on the first reflection layer;
 e) forming a diffractive second relief structure on a second surface of the structure layer; and
 f) forming a region-wise second reflection layer on the second surface of the structure layer in a layer thickness, with which a side of the second reflection layer remote from the structure layer is shaped with the second relief structure,
 wherein, in step f), the second reflection layer is applied over a full surface area involved, a second photoresist layer is applied over a full surface area to the second reflection layer, the second photoresist layer is partially exposed and removed in regions, the second reflection layer is removed by etching in the regions in which the second photoresist layer was removed, and remaining regions of the second photoresist layer are removed.

12. A process according to claim 11, wherein exposure of the second photoresist layer is effected through the first and second reflection layers, wherein partial exposure of the second photoresist layer is effected in dependence on the configuration and/or arrangement of the first relief structure and/or the second relief structure.

* * * * *